United States Patent
Park et al.

(10) Patent No.: US 8,592,235 B2
(45) Date of Patent: Nov. 26, 2013

(54) METHOD FOR PREPARING PHOSPHOR AND LIGHT EMITTING DEVICE

(75) Inventors: Youn Gon Park, Gyeonggi-do (KR); Chul Soo Yoon, Gyeonggi-do (KR); Won Young Song, Seoul (KR); Sang Hyun Kim, Seoul (KR); Hyong Sik Won, Gyeonggi-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 10 days.

(21) Appl. No.: 13/310,390

(22) Filed: Dec. 2, 2011

(65) Prior Publication Data

US 2012/0138992 A1    Jun. 7, 2012

(30) Foreign Application Priority Data

Dec. 3, 2010   (KR) .................. 10-2010-0122623

(51) Int. Cl.
*H01L 21/00* (2006.01)
(52) U.S. Cl.
USPC .......................................... 438/29

(58) Field of Classification Search
CPC .. H01L 33/0079; H01L 27/1214; H01L 51/56
USPC .............................................. 438/22, 25, 29
See application file for complete search history.

(56) References Cited

U.S. PATENT DOCUMENTS

2010/0164365 A1*  7/2010  Yoshino et al. ............... 313/503

FOREIGN PATENT DOCUMENTS

| JP | 2005-097011 | | 4/2005 |
| KR | 10-2000-0034331 A | | 6/2000 |
| WO | WO2007/091687 | * | 8/2007 |

OTHER PUBLICATIONS

Ng, "Complete Guide to semiconductor devices", 2002, John Wiley & Sons, New York, p. 708, Table E4.2.*

* cited by examiner

*Primary Examiner* — Nikolay Yushin
(74) *Attorney, Agent, or Firm* — McDermott Will & Emery LLP

(57) ABSTRACT

A method for preparing a phosphor includes: dissolving at least one metal as a raw material of a desired phosphor in liquid ammonia to form a metal-amide type precursor; gathering the metal-amide type precursor; and firing the precursor to form a desired phosphor.

18 Claims, 8 Drawing Sheets

METHOD FOR PREPARING PHOSPHOR AND LIGHT EMITTING DEVICE

CROSS-REFERENCE TO RELATED APPLICATIONS

This application claims the priority of Korean Patent Application No. 10-2010-0122623 filed on Dec. 3, 2010, in the Korean Intellectual Property Office, the disclosure of which is incorporated herein by reference.

BACKGROUND OF THE INVENTION

1. Field of the Invention

The present invention relates to a method for preparing a phosphor and, more particularly, to a method for preparing a phosphor having high luminescent properties and excellent thermal and chemical stability, and a light emitting device using the same.

2. Description of the Related Art

In general, a phosphor is used as a material for converting a particular wavelength of light from various types of light sources into a desired wavelength of light. In particular, among various light sources, a light emitting diode (LED) driven with low power consumption and having excellent light efficiency may be advantageously applied as a backlight of a liquid crystal display (LCD), for vehicle illumination, and as a household illumination system (or a household lighting system). Thus, recently, a phosphor material has come to prominence as a core technology.

Recently, a technique for implementing white light, similar to natural light as defined in CIE color coordinates, is being developed and research into a white LED element for emitting white light is actively ongoing.

The white LED element is manufactured by applying phosphors having an emission spectrum such as blue, green, yellow, red, or the like, to an LED chip having a blue or ultraviolet light source. Various phosphors used herein and the luminous efficiency thereof play an important role in determining the characteristics and efficiency of the white LED element.

In a related art phosphor preparation method, a metal compound for preparing a phosphor is measured, a mixture thereof is formed, and then, a phosphor is prepared by firing the mixture at a high temperature.

However, the phosphor obtained through the firing operation at a high temperature does not have a guaranteed uniform composition distribution and powder of the sintered phosphor may cohere, leading to have a relatively large grain size (or granularity). Thus, in order to obtain a uniform, fine grain size, the sintered phosphor is required to be ground through a grinding process.

Also, when the phosphor is a nitride-based phosphor, it may be difficult to sinter, causing a problem in the process requiring a high pressure condition along with a high temperature firing process.

SUMMARY OF THE INVENTION

An aspect of the present invention provides a method for preparing a phosphor having a uniform composition and being executed in a relatively low temperature process.

Another aspect of the present invention provides a light emitting device using the phosphor obtained through the preparation method.

According to an aspect of the present invention, there is provided a method for preparing a phosphor, including: dissolving (or melting) at least one metal as a raw material of a desired phosphor in liquid ammonia to form a metal-amide type precursor; gathering the metal-amide type precursor; and firing the precursor to form a desired phosphor.

The at least one metal may be a plurality of metals. In this case, the forming of the metal-amide type precursor may include: putting the plurality of metals into the liquid ammonia to dissolve the metals.

When the at least one metal is a plurality of metals, the forming of the metal-amide type precursor may include: classifying the plurality of metals into one or two types of metal groups; and dissolving the classified metal groups in liquid ammonia prepared in different respective baths, wherein the precursors of the liquid ammonia prepared in the different baths may be mixed before the firing operation.

The mixing of the precursor may be performed after the liquid ammonia is vaporized.

The plurality of metals may include at least one of Group V elements and at least one of Group I to Group III elements.

The plurality of metals may include at least one type of rare earth element, and the rare earth element may be selected from the group consisting of cerium (Ce), praseodymium (Pr), neodymium (Nd), samarium (Sm), europium (Eu), gadolinium (Gd), terbium (Tb), dysprosium (Dy), Holmium (Ho), erbium (Er), thulium (Tm), and ytterbium (Yb).

The gathering of the metal-amide type precursor may be performed by vaporizing the liquid ammonia so that the precursor remains.

The vaporizing of the liquid ammonia may be performed by the stepwise increasing of the temperature of the liquid ammonia.

The precursor obtained after vaporizing the liquid ammonia may be in a powdered state. In this case, the precursor powder may be fine powder having an average grain size of about 1 μm or less.

Adjusting of the grain size of the precursor by aging the precursor in the liquid ammonia may be performed between the forming of the precursor and the vaporizing of the liquid ammonia.

The firing of the precursor may be performed within a temperature range of 150° C. to 1,500° C.

The firing of the precursor may be performed under an atmosphere of at least one selected from among atmosphere, nitrogen ($N_2$), oxygen ($O_2$), and ammonia ($NH_3$).

The phosphor obtained according to the preparation method may be a nitride phosphor or oxynitride phosphor.

According to another aspect of the present invention, there is provided a white light emitting device including: a light emitting diode (LED) chip emitting excitation light having a peak wavelength ranging from 200 nm to 500 nm; and a phosphor disposed around the LED chip to wavelength-convert at least a certain amount of the excitation light and obtained according to the foregoing preparation method.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
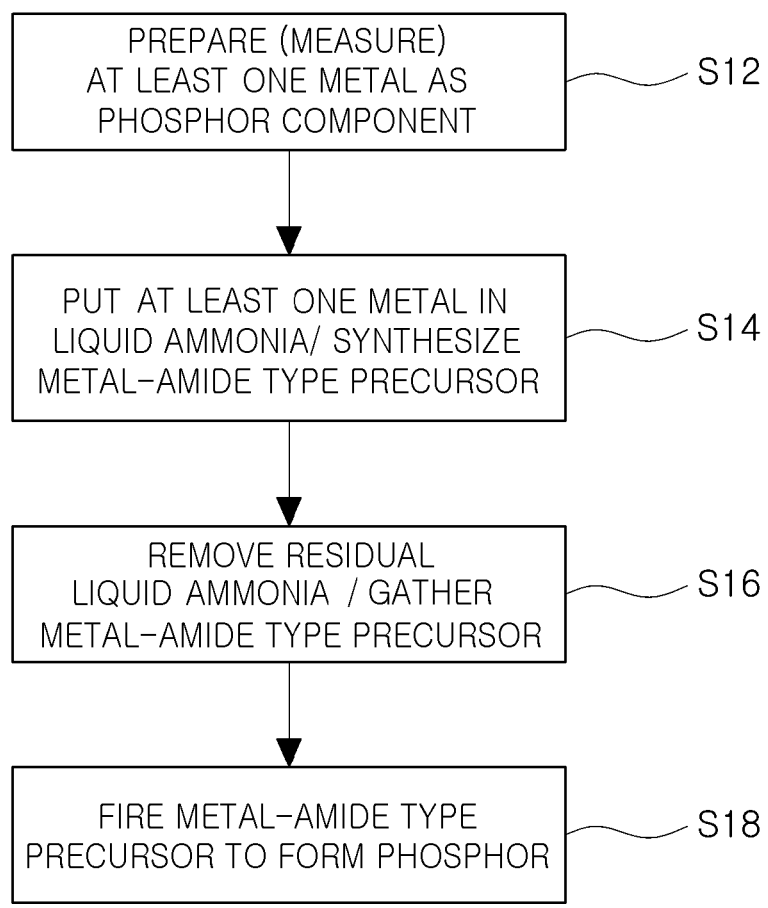
FIG. 1 is a flow chart illustrating the process of a method for preparing a phosphor according to an exemplary embodiment of the present invention.

Exemplary embodiments of the present invention will now be described in detail with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

FIG. 1 is a flow chart illustrating the process of a method for preparing a phosphor according to an exemplary embodiment of the present invention.

With reference to FIG. 1, a method for preparing a phosphor according to an exemplary embodiment of the present invention may start from step S12 of preparing at least one metal.

The metal prepared in step S12, an element constituting a phosphor material, may be one metal, or may be two or more types of metals in case of a phosphor of a complex metal compound including two types or more of metals.

In case of the plurality of metals, they may include at least one of Group IV elements and at least one of Group I to Group III elements. For example, when β-SiAlON is desired to be prepared, silicon (Si) and aluminum (Al) may be measured to have a desired ratio to prepare β-SiAlON in step S12.

In addition, the plurality of metals may include at least one or more types of rare earth elements. The rare earth elements may be selected from the group consisting of cerium (Ce), praseodymium (Pr), neodymium (Nd), samarium (Sm), europium (Eu), gadolinium (Gd), terbium (Tb), dysprosium (Dy), Holmium (Ho), erbium (Er), thulium (Tm), and ytterbium (Yb).

Next, in step S14, the at least one metal as a phosphor material is dissolved in liquid ammonia to form a metal-amide type precursor.

In this step, the liquid ammonia obtained by liquefying ammonia (NH$_3$) is employed as the solvent for dissolving (or melting) metal. Ammonia gas can be liquefied at about −40° C. or lower. Thus, liquid ammonia can be easily prepared by using a relatively simple liquid nitride bath or an ultra-low refrigerated circulator. The liquefying process may be performed under an atmosphere of dry nitrogen or under an atmosphere of inert gas such as argon (Ar), or the like.

In order to obtain such liquid ammonia, a large amount of ammonia gas is required, so it is necessary to control the high viscosity and low mobility of the ammonia gas, and in consideration of this, the structure of a pipe supplying the ammonia gas is preferably maintained at a temperature of at least 40° C.

Metal put into the liquid ammonia may be dissolved to form a relatively homogeneous metal ammonia solution. In this process, the liquid ammonia and the metal are reacted to form a metal-amide type precursor. For example, in case of Eu metal, NH3 may be dissolved to form Eu(NH$_2$)$_2$, and in case of Al metal, Al(NH$_2$)$_2$ may be formed.

Subsequently, in step S16, the liquid ammonia remaining after the synthesizing reaction is removed to gather the metal metal-amide type precursor.

This step may be easily performed by vaporizing the liquid ammonia. Namely, the temperature of the liquid ammonia after the synthesizing reaction is increased to be higher than a liquefaction point of ammonia to vaporize the liquid ammonia into ammonia gas, thus precipitating the metal-amide type precursor so as to be easily gathered. For example, the vaporization temperature for gathering the precursor may be room temperature after lifting the refrigerating condition.

The process of vaporizing the liquid ammonia may be a stepwise temperature increasing process. The precursor obtained after the step of vaporizing the liquid ammonia may be in a powdered state. In this case, the precursor powder may be fine powder having an average grain size of about 1 µm or less. The grain size of the precursor can be adjusted through such a stepwise temperature increasing condition.

The grain size of the precursor may be more effectively adjusted by aging the precursor in the liquid ammonia before gathering the precursor (in step S16). In this manner, in the present exemplary embodiment, the fine powder form can be formed on the precursor level and the grain size of the precursor can be adjusted.

Finally, in step S18, the metal-amide type precursor is fired to form a desired phosphor.

The metal-amide precursor has high reactivity compared with that of the conventional metal compound, so it can be sintered at a relatively low firing temperature lower than that of the general firing temperature thereof (e.g., 1,600° C. or higher). For example, the precursor firing step may be performed at a temperature ranging from 150° C. to 1,500° C., preferably, at 1,000° C. or lower, and more preferably, at 550° C. or lower.

The firing process may be performed in an atmosphere of at least one selected from among atmosphere, nitrogen (N$_2$), oxygen (O$_2$), and ammonia (NH$_3$). A phosphor having a desired sintered ceramic form can be obtained from the metal-amide type precursor through the firing process.

Since the phosphor obtained in this process is obtained from the amide type containing a nitrogen component, it may be a nitride phosphor, and in this case, the phosphor may include an oxygen component under a final firing atmosphere to form an oxynitride-based phosphor.

Since the phosphor uses the precursor obtained through a relative homogeneous mixture in the liquid ammonia, uniform mixing of the raw materials is guaranteed, and since the precursor is obtained in the fine powder form, its grain size can be adjusted, which is thus very advantageous for preparing an optimized phosphor. Also, since the phosphor uses the precursor having a good reactivity, the phosphor can be obtained at a low firing temperature.

The at least one metal may be a plurality of metals. In this case, the forming of the metal-amide type precursor may include inputting the plurality of metals in the liquid ammonia and dissolving them.

Figure 2A:
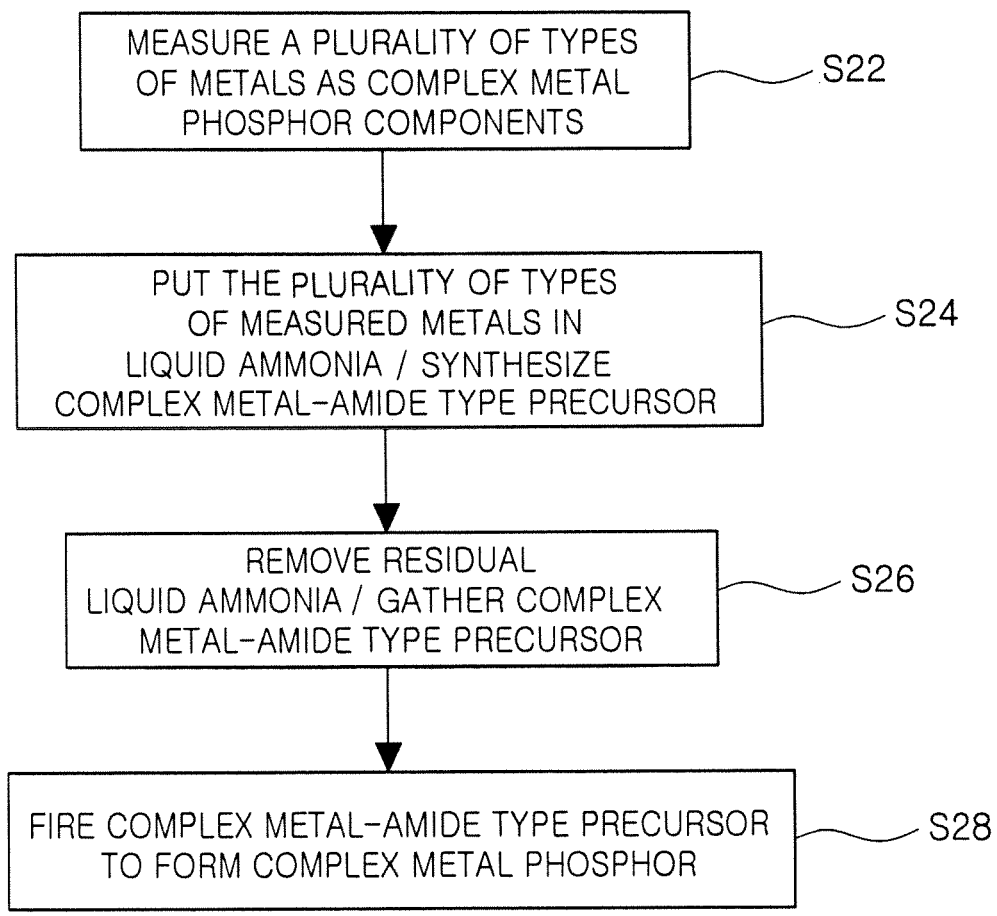
FIGS. 2A and 2B are flow charts illustrating the process of a method for preparing a complex metal phosphor according to an exemplary embodiment of the present invention.
Figure 2B:
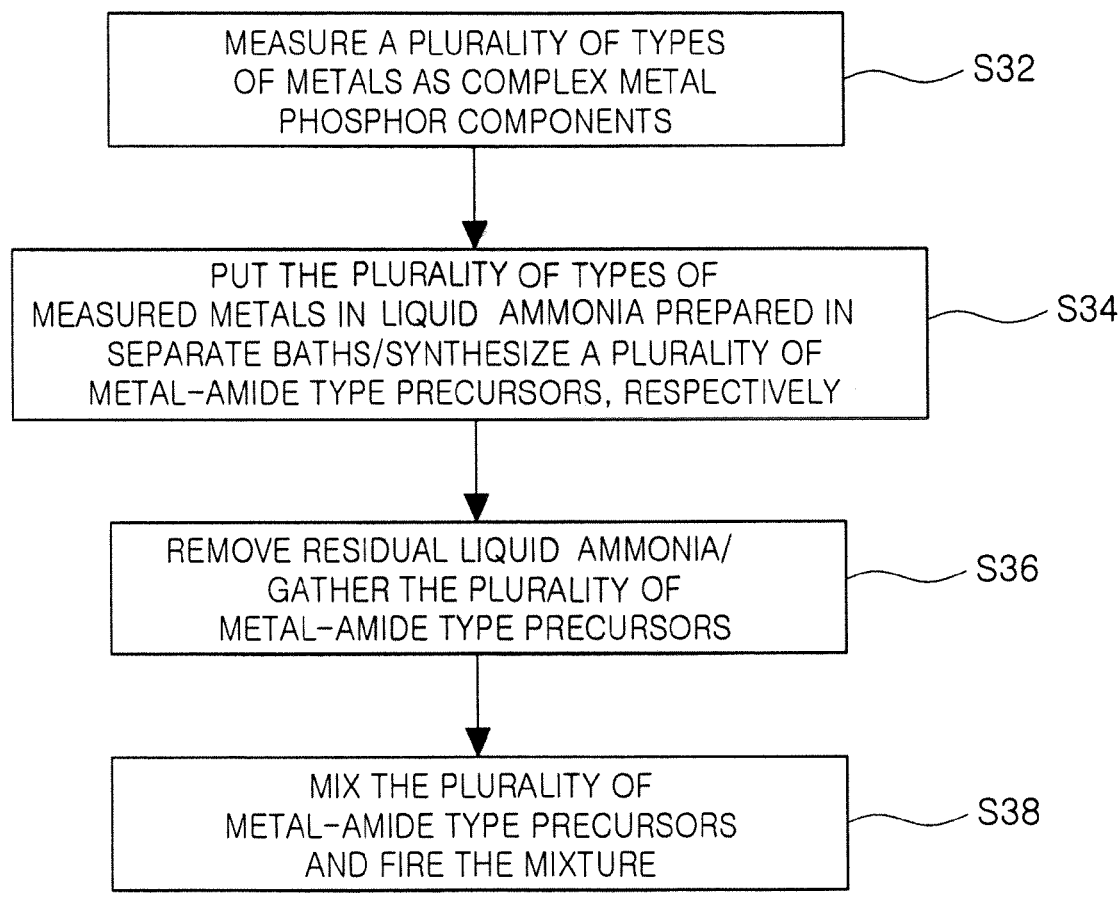

The method for preparing a phosphor according to an exemplary embodiment of the present invention can be advantageously applicable to a complex metal phosphor containing a plurality of metals. FIGS. 2A and 2B are flow charts illustrating the process of a method for preparing a complex metal phosphor according to an exemplary embodiment of the present invention.

First, with reference to FIG. 2A, a first example of the method for preparing a complex metal phosphor starts from step (S22) of preparing a plurality of types of metals corresponding to components of the complex metal phosphor. The respective metals may be measured in consideration of the ratio required in a final phosphor.

Next, in step S24, the plurality of types of measured metals are put into liquid ammonia together to form a complex metal-amide type precursor.

For example, in order to obtain β-SiAlON, metal silicon and metal aluminum measured to have an appropriate ratio may be put into liquid ammonia prepared in a liquefied nitrogen bath together, or may be sequentially put into the bath to form an amide type precursor containing silicon and aluminum.

Then, in step S26, extra liquid ammonia is removed and the complex metal-amide type precursor is gathered.

This step may be easily performed by increasing the temperature of the liquid ammonia to a point at which the liquid ammonia can be vaporized, as described above in step S16 illustrated in FIG. 1. Also, the grain size of the precursor can be adjusted by performing an appropriate aging process before the vaporization process or by regulating the temperature increasing process. This may be reflected in the grain size of final phosphor powder.

Finally, in step S28, the complex metal-amide type precursor may be fired to form a desired complex metal phosphor.

The complex metal-amide type precursor has high reactivity, so it can form a complex metal phosphor of a desired sintered ceramic through a firing process performed at a relatively low temperature.

The method for preparing a complex metal phosphor according to an exemplary embodiment of the present invention can be performed according to the process as shown in FIG. 2B, different to the process shown in FIG. 2A.

With reference to FIG. 2B, a second example of the method for preparing a complex metal phosphor starts from step S32 of preparing a plurality of types of metals corresponding to constituents of a complex metal phosphor. The respective metals may be measured in consideration of a metal content ratio required for a final complex metal phosphor.

Next, in step S34, the plurality of types of measured metals are put into separately prepared liquid ammonia to form a plurality of metal-amide type precursors.

For example, in order to obtain β-SiAlON, metal silicon and metal aluminum measured to have an appropriate ratio are separately inserted into liquid ammonia prepared in two liquefied nitrogen baths to respectively form silicon amide and aluminum amide.

Of course, three baths may be used in the case of using three or more metals, but two baths may be used and two metals may be put into a single bath to prepare a complex metal amide. In this manner, a plurality of metals may be classified into two or more metals, and the two or more classified metals may be dissolved in liquid ammonia separately prepared in different baths.

Then, in step S36, extra liquid ammonia prepared in the different baths is removed and a metal-amide type precursor is gathered from each bath.

This step may also be easily performed by increasing the temperature of the liquid ammonia to a point at which the liquid ammonia can be vaporized, as described above in step S16 of FIG. 1. Also, the grain size of the precursor can be adjusted by performing an appropriate aging process before the vaporization process or by regulating the temperature increasing process.

Finally, in step S38, the metal-amide type precursors gathered from the respective baths are mixed and then fired to form a desired complex metal phosphor.

Various types of oxynitride phosphors, as well as the nitride phosphor, may be provided to be applicable as the complex metal phosphor in the foregoing complex metal phosphor preparation method. For example, a red phosphor may be a $MAlSiN_x$:Re($1 \leq x \leq 5$) nitride-based phosphor, and a green phosphor may be at least one of an $M_xA_yO_xN_{(4/3)y}$ oxynitride phosphor, a $M_aA_bO_cN_{(2/3)a+(4/3)b-(2/3)c}$ oxynitride phosphor, and a β-SiAlON phosphor, and a brass yellow phosphor may be a α-SiAlON:Re-based phosphor.

Here, M is at least one element selected from among beryllium (Be), barium (Ba), strontium (Sr), calcium (Ca), magnesium (Mg), A is at least one Group IV element selected from the group consisting of carbon (C), silicon (Si), germanium (Ge), tin (Sn), titanium (Ti), zirconium (Zr), and hafnium (Hf), or may be at least one selected from among cerium (Ce), praseodymium (Pr), neodymium (Nd), samarium (Sm), europium (Eu), gadolinium (Gd), terbium (Tb), dysprosium (Dy), Holmium (Ho), erbium (Er), thulium (Tm), and ytterbium (Yb).

Various operations and effects of the present invention will now be described in more detail through specific exemplary embodiments.

Embodiment 0.5 g of Eu metal (99.9%: Santoky Co.) was prepared. Ammonia ($NH_3$) gas (Iwantani Ind. Ltd.) was purified, and about 1350 $cm^3$ of ammonia was put into a 50 $cm^3$ of a stainless steel reactor under an atmosphere of dry $N_2$ so as to be cooled into dry ice and then liquefied. The previously measured Eu metal was put into the reactor with the liquid ammonia prepared therein and dissolved (or melted).

Figure 3A:
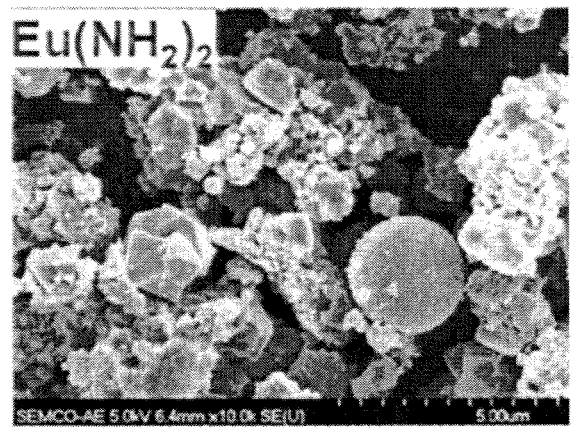
FIGS. 3A and 3B are SEM photographs of a metal-amide type precursor (Eu(NH$_2$)$_2$) obtained according to an exemplary embodiment of the present invention.
Figure 3B:
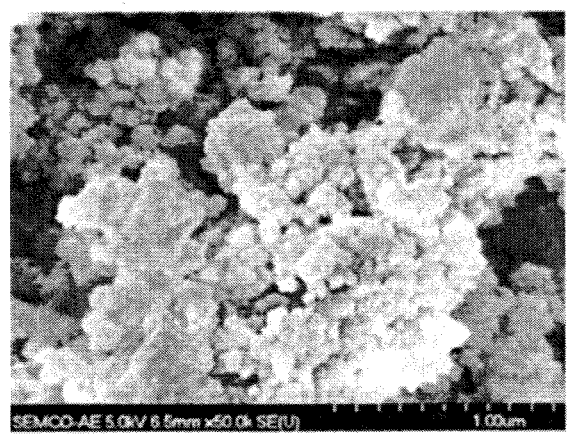
Figure 4:
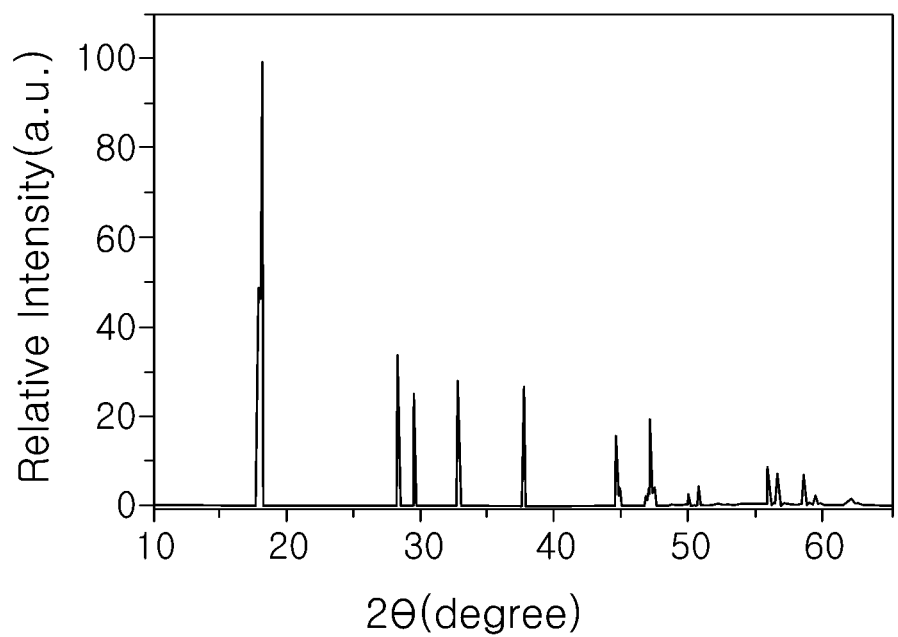
FIG. 4 is a graph of an XRD pattern of the metal-amide type precursor (Eu(NH$_2$)$_2$) obtained according to an exemplary embodiment of the present invention.

In this process, a homogeneous Eu amide ($Eu(NH_2)_2$) precursor was synthesized, the temperature of extra liquid ammonia was increased to 273K so as to be vaporized, and Eu $(NH_2)_2$ remaining in the form of a precipitate was gathered. The $Eu(NH_2)_2$ obtained through this process was obtained in the form of fine powder in the precursor level as shown in FIGS. 3A and 3B. It was confirmed through an XRD pattern of FIG. 4 that the precursor gathered in this process was $Eu(NH_2)_2$.

Figure 5A:
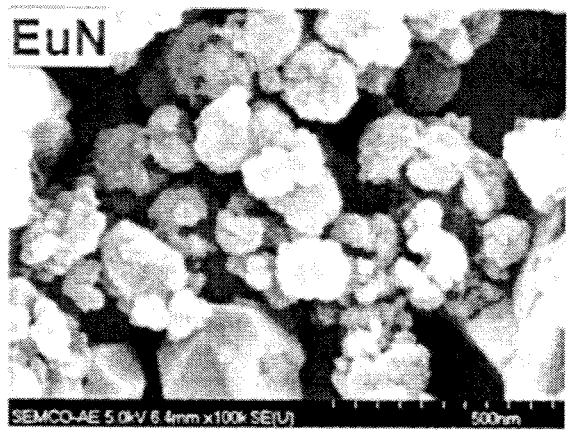
FIGS. 5A and 5B are SEM photographs of a phosphor (EuN) prepared according to an exemplary embodiment of the present invention.
Figure 5B:
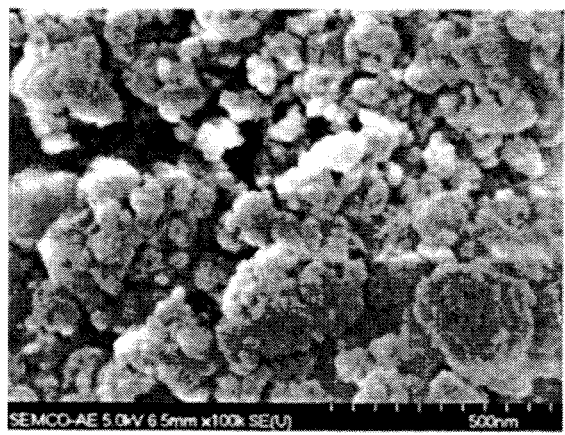
Figure 6:
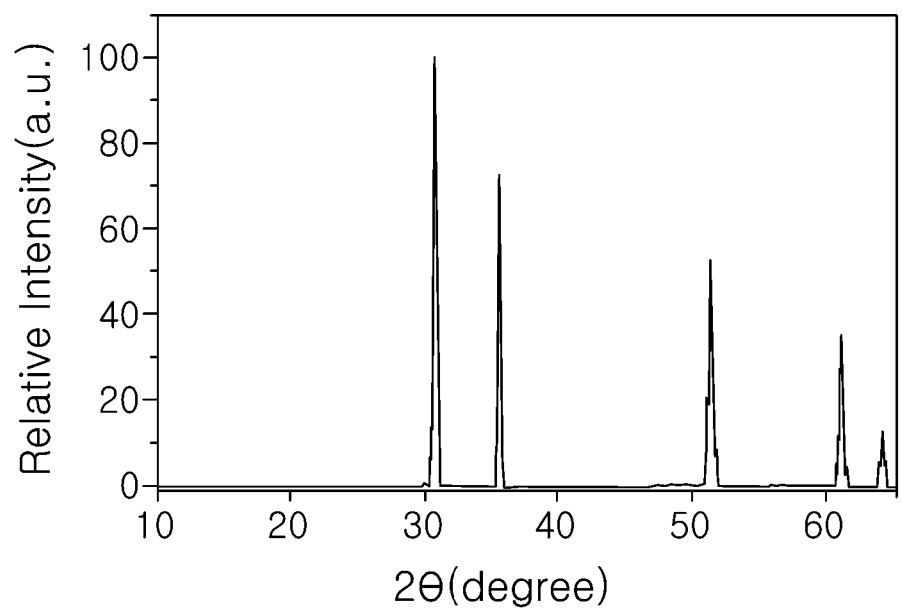
FIG. 6 is a graph of an XRD pattern of the phosphor (EuN) prepared according to an exemplary embodiment of the present invention.

Thereafter, the gathered $Eu(NH_2)_2$ precursor was fired at about 573K (about 300° C.) for one hour. As a result, a sintered nitride EuN was obtained as can be confirmed in an XRD pattern of FIG. 6. As shown in the SEM photographs of EuN in FIGS. 5A and 5B, it is noted that a final phosphor is fine powder of nano crystals having a grain size ranging from tens to hundreds of nm.

In this manner, the phosphor can be obtained even at the low firing temperature by using the metal-amide precursor having excellent reactivity, and since the fine powder is obtained at the precursor level, the phosphor powder of fine nano level can be prepared by adjusting the grain size of the precursor.

Figure 7A:
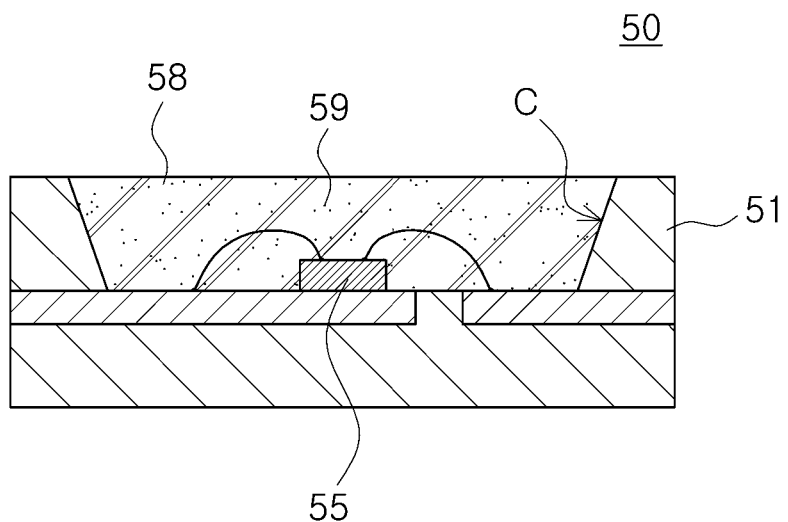
FIGS. 7A and 7B are views illustrating a semiconductor light emitting device to which the phosphor prepared according to an exemplary embodiment of the present invention may be applicable.
Figure 7B:
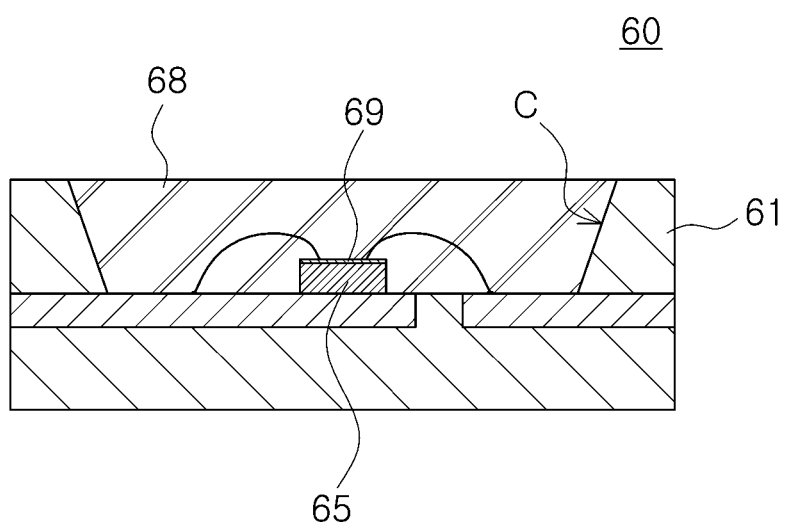

In this manner, the foregoing phosphor can be applied in various package forms so as to be applicable to a light emitting device providing white light. FIGS. 7A and 7B are views illustrating a semiconductor light emitting device to which the phosphor prepared according to an exemplary embodiment of the present invention can be applicable.

A white light emitting device 50 illustrated in FIG. 7A includes a substrate 51 having two lead frames 52a and 52b formed therein.

A near-ultraviolet or blue light emitting diode (LED) 55 is formed on the substrate 51, and two electrodes (not shown) of the near-ultraviolet or blue LED 55 may be connected to the lead frames 52a and 52b through wires, respectively.

Also, a resin packaging part 58 containing a phosphor 59 may be formed to surround and cover the LED 55 by using a white light emission phosphor including the phosphor according to an exemplary embodiment of the present invention or a mixture with a different phosphor. The resin packaging part 58 may be formed by appropriately mixing the foregoing phosphor or the mixture 59 in a curable transparent resin such as an epoxy resin, a silicon resin, or a mixture of the silicon resin and epoxy resin.

Unlike this embodiment, a white light emitting device 60 illustrated in FIG. 7B may be configured such that the phosphor may be formed as a film 69, rather than such a form in which the phosphor is mixed in the interior of the resin packaging part.

As shown in FIG. 7B, the light emitting device 60 according to this exemplary embodiment includes a package main body 61 with two lead frames 62a and 62b formed therein. The package main body 61 may have a structure having a concave part C formed therein.

The phosphor film 69 employed in the white light emitting device 60 illustrated in FIG. 7B is formed on an upper surface of an LED 65.

The near-ultraviolet or blue light emitting diode (LED) 65 is formed on the package main body 61, and two electrodes (not shown) of the near-ultraviolet or blue LED 55 may be connected to the lead frames 62a and 62b through wires, respectively. Also, a resin packaging part 68 made of a transparent resin is formed to surround and cover the LED 65 in the concave part C.

The LEDs 55 and 65 employed in the white light emitting devices 50 and 60 may be an ultraviolet or a near-ultraviolet LED emitting light having a wavelength ranging from 200 nm to 410 nm or a blue or quasi-blue LED emitting light having wavelength ranging from 410 nm to 500 nm.

As set forth above, according to exemplary embodiments of the invention, since a phosphor is prepared from a precursor obtained by melting measured metal in liquid ammonia, the phosphor can have a uniform composition distribution. Also, since the firing process is executed in the state of highly reactive precursor, the phosphor can be prepared at a relatively low firing temperature. In addition, the phosphor can be obtained in the form of fine nano-level powder by regulating the precursor synthesizing step or firing process, without performing a grinding process.

While the present invention has been shown and described in connection with the exemplary embodiments, it will be apparent to those skilled in the art that modifications and variations can be made without departing from the spirit and scope of the invention as defined by the appended claims.

What is claimed is:

1. A method for preparing a phosphor, the method comprising:
    dissolving at least one metal as a raw material of a desired phosphor in liquid ammonia to form a metal-amide type precursor;
    adjusting a grain size of the precursor by aging the precursor in the liquid ammonia;
    gathering the metal-amide type precursor; and
    firing the precursor to form a desired phosphor.

2. The method of claim 1, wherein the at least one metal is a plurality of metals.

3. The method of claim 2, wherein the forming of the metal-amide type precursor comprises putting the plurality of metals into the liquid ammonia to dissolve the metals.

4. The method of claim 1, wherein the forming of the metal-amide type precursor comprises:
    classifying the plurality of metals into one or two types of metal groups; and
    dissolving the classified metal groups in liquid ammonia prepared in different respective baths,
    wherein the precursors of the liquid ammonia prepared in the different baths are mixed before the firing operation.

5. The method of claim 4, wherein the mixing of the precursor is performed after the liquid ammonia is vaporized.

6. The method of claim 2, wherein the plurality of metals may include at least one of Group IV elements and at least one of Group I to Group III elements.

7. The method of claim 6, wherein the plurality of metals comprises at least one type of rare earth element, and rare earth element may be selected from the group consisting of cerium (Ce), praseodymium (Pr), neodymium (Nd), samarium (Sm), europium (Eu), gadolinium (Gd), terbium (Tb), dysprosium (Dy), Holmium (Ho), erbium (Er), thulium (Tm), and ytterbium (Yb).

8. The method of claim 1, wherein the gathering of the metal-amide type precursor is performed by vaporizing the liquid ammonia so that the precursor remains.

9. The method of claim 8, wherein the vaporizing of the liquid ammonia is performed by the stepwise increasing of the temperature of the liquid ammonia.

10. The method of claim 8, wherein the precursor obtained after vaporizing the liquid ammonia is in a powdered state.

11. The method of claim 10, wherein the precursor powder is fine powder having an average grain size of about 1 μm or less.

12. The method of claim 1, wherein the firing of the precursor is performed within a temperature range of 150° C. to 1,500° C.

13. The method of claim 1, wherein the firing of the precursor is performed under an atmosphere of at least one selected from among atmosphere, nitrogen ($N_2$), oxygen ($O_2$), and ammonia ($NH_3$).

14. The method of claim 1, wherein the phosphor is a nitride phosphor or oxynitride phosphor.

15. A phosphor prepared by claim 1.

16. A white light emitting device comprising:
    a light emitting diode (LED) chip emitting excitation light having a peak wavelength ranging from 200 nm to 500 nm; and
    a phosphor obtained by the method according to claim 1 disposed around the LED chip configured to wavelength-convert at least a certain amount of the excitation light.

17. The method of claim 8, wherein a vaporization temperature for gathering the precursor is room temperature.

18. The method of claim 1, wherein the liquid ammonia is obtained by condensing ammonia gas supplied by a pipe maintained at a temperature of at least 40° C.

* * * * *